United States Patent
Onodera

(10) Patent No.: US 7,243,283 B2
(45) Date of Patent: Jul. 10, 2007

(54) SEMICONDUCTOR DEVICE WITH SELF-TEST CIRCUITS AND TEST METHOD THEREOF

(75) Inventor: Mitsuru Onodera, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 133 days.

(21) Appl. No.: 11/095,662

(22) Filed: Apr. 1, 2005

(65) Prior Publication Data

US 2006/0107150 A1  May 18, 2006

(30) Foreign Application Priority Data

Sep. 27, 2004  (JP) .............................. 2004-278672

(51) Int. Cl.
*G01R 31/28* (2006.01)
(52) U.S. Cl. ...................... 714/733; 714/735; 714/738; 714/719; 714/30; 324/73.1; 324/763
(58) Field of Classification Search ................ 714/720, 714/733, 735, 738, 719, 30; 324/763
See application file for complete search history.

(56) References Cited

U.S. PATENT DOCUMENTS

| | | | | |
|---|---|---|---|---|
| 5,553,082 A | * | 9/1996 | Connor et al. .............. | 714/733 |
| 6,587,979 B1 | * | 7/2003 | Kraus et al. ................. | 714/720 |
| 6,591,388 B1 | * | 7/2003 | Vonreyn ...................... | 714/726 |
| 6,829,728 B2 | * | 12/2004 | Cheng et al. ................. | 714/30 |
| 6,934,205 B1 | * | 8/2005 | Pandey et al. .............. | 365/201 |
| 7,119,567 B2 | * | 10/2006 | Ma et al. ..................... | 324/763 |

FOREIGN PATENT DOCUMENTS

JP          9-218735          8/1997

* cited by examiner

*Primary Examiner*—Guy Lamarre
*Assistant Examiner*—Esaw Abraham
(74) *Attorney, Agent, or Firm*—Arent Fox LLP

(57) ABSTRACT

A semiconductor device having a plurality of circuits with the same configuration, wherein since expected values in the number corresponding to the number of circuits are not required, operation tests are effectively performed in a short time. The semiconductor device has first, second and third digital filters with the same configuration. To test these digital filters, comparison circuits comparing an output value and an expected value are individually provided per one digital filter. The digital filters and the comparison circuits are daisy-chained such that the output values of the first and second digital filters are input as the expected values of the comparison circuits corresponding to the second and third digital filters, respectively. When the same test signal is input to each digital filter from a built-in self test (BIST) controller, abnormal circuits can be detected based on comparison results of the comparison circuits.

9 Claims, 8 Drawing Sheets

SEMICONDUCTOR DEVICE WITH SELF-TEST CIRCUITS AND TEST METHOD THEREOF

CROSS-REFERENCE TO RELATED APPLICATIONS

This application is based upon and claims the benefits of priority from the prior Japanese Patent Application No. 2004-278672, filed on Sep. 27, 2004, the entire contents of which are incorporated herein by reference.

BACKGROUND OF THE INVENTION

1. Field of the Invention

The present invention relates to a semiconductor device including a plurality of electric circuits having the same configuration, which are mounted on the same semiconductor chip. The invention also pertains to a test method of the device.

2. Description of the Related Art

When a plurality of electric circuits having the same configuration are formed on one LSI chip, it is desired that these circuits having the same configuration is effectively tested in the manufacturing process. For example, it is recently required to perform a high-speed data transfer between LSI chips, boards or chassis. In a signal receiving circuit including a clock recovery circuit used for correctly performing such a signal reception between LSI chips, a plurality of circuits having the same configuration are usually mounted on the same chip according to the number of signals to be transmitted between the LSI chips.

FIG. 8 shows a schematic configuration of a digital filter and a test circuit thereof provided on a conventional signal receiving circuit.

On an LSI chip 500 shown in FIG. 8, a digital filter 510 is provided as a part of a signal receiving circuit. A plurality of the filters 510 having the same configuration are mounted on the LSI chip 500 according to the number of receiving channels of the signals.

As shown in FIG. 8, the digital filter 510 has a Phase to Digital Converter (PDC) 511 that receives signals from an internal circuit of the LSI chip 500, a register 512, and an addition circuit 513 that adds respective outputs of the PDC 511 and the register 512 and feeds back the result to the register 512. In this digital filter 510, an integration circuit is configured by the register 512 and the addition circuit 513.

Conventionally, an operation test of this digital filter 510 is carried out as follows. A BIST (Built-In Self Test) controller 520 used for realizing a BIST is previously provided on the LSI chip 500. From the BIST controller 520, a control signal is imparted to the PDC 511 to allow the PDC 511 to act as an output circuit of a test pattern. At this time, the integration circuit including the register 512 and the addition circuit 513 is operated as a test target circuit. Concretely, an output value of the PDC 511 is set, for example, to a fixed value of "1" by the control of the BIST controller 520. At this time, the integration circuit including the register 512 and the addition circuit 513 executes an increment operation by "plus one". Then, an output value of the integration circuit is inputted to a comparison circuit 600 outside the LSI chip 500 and compared with an expected value of a test pattern, whereby it can be determined whether the digital filter 510 is correctly operated.

For a conventional related art, a system is disclosed in which a plurality of controlled devices are daisy-chained to a controller by cables. In the system, four signal lines are newly added to existing signal lines. Termination setting state check circuits having the same configuration, which are connected by these four signal lines, are mounted within the respective controlled devices. When an ID of the controlled device is designated from the controller through three signal lines among the above-described signal lines, a response signal is fed back from any one of the termination setting state check circuits through the other signal line, whereby a control disabling factor can be specified. See, e.g., Japanese Unexamined Patent Publication No. Hei 9-218735, paragraph numbers [0008] to [0013] and FIG. 2.

In the above-described test method shown in FIG. 8, a test must be performed for each unit of a signal receiving circuit and therefore, as the number of receiving channels is larger, a test time is more increased. In addition, since an exterior comparison circuit 600 is used, a lot of trouble of connecting a device is taken in performing a test for all the units. Further, expected values of a test pattern for the comparison by the comparison circuit 600 must be prepared separately, and moreover, the expected values must be prepared as many as the number of units.

SUMMARY OF THE INVENTION

The present invention has been made in view of the above circumstances. An object of the present invention is to provide a semiconductor device including a plurality of circuits having the same configuration, wherein since the expected value in the number corresponding to the number of circuits is not required, an operation test can be effectively performed in a short time.

Another object of the present invention is to provide a test method of a semiconductor device including a plurality of circuits having the same configuration, wherein since the expected value in the number corresponding to the number of circuits is not required, an operation test can be effectively performed in a short time.

To accomplish the above objects, according to one aspect of the present invention, there is provided a semiconductor device including a plurality of electric circuits having the same configuration, which are mounted on the same semiconductor chip. This device comprises a plurality of comparison circuits are individually provided per one electric circuit and compare an output value and an expected value of each electric circuit. The electric circuit and the comparison circuit are daisy-chained such that the output value of the electric circuit is inputted as the expected value of the comparison circuit corresponding to another electric circuit.

According to another aspect of the present invention, there is provided a test method of a semiconductor device including a plurality of electric circuits having the same configuration, which are mounted on the same semiconductor chip. This test method comprises the steps of: (1) individually providing comparison circuits that compare an output value and an expected value of each electric circuit are individually provided per one electric circuit, (2) daisy-chaining the electric circuit and the comparison circuit such that the output value of the electric circuit is inputted as the expected value of the comparison circuit corresponding to another electric circuit, and (3) inputting the same test signal to each electric circuit to allow the comparison result of at least one of the comparison circuits to be outputted as the test results.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
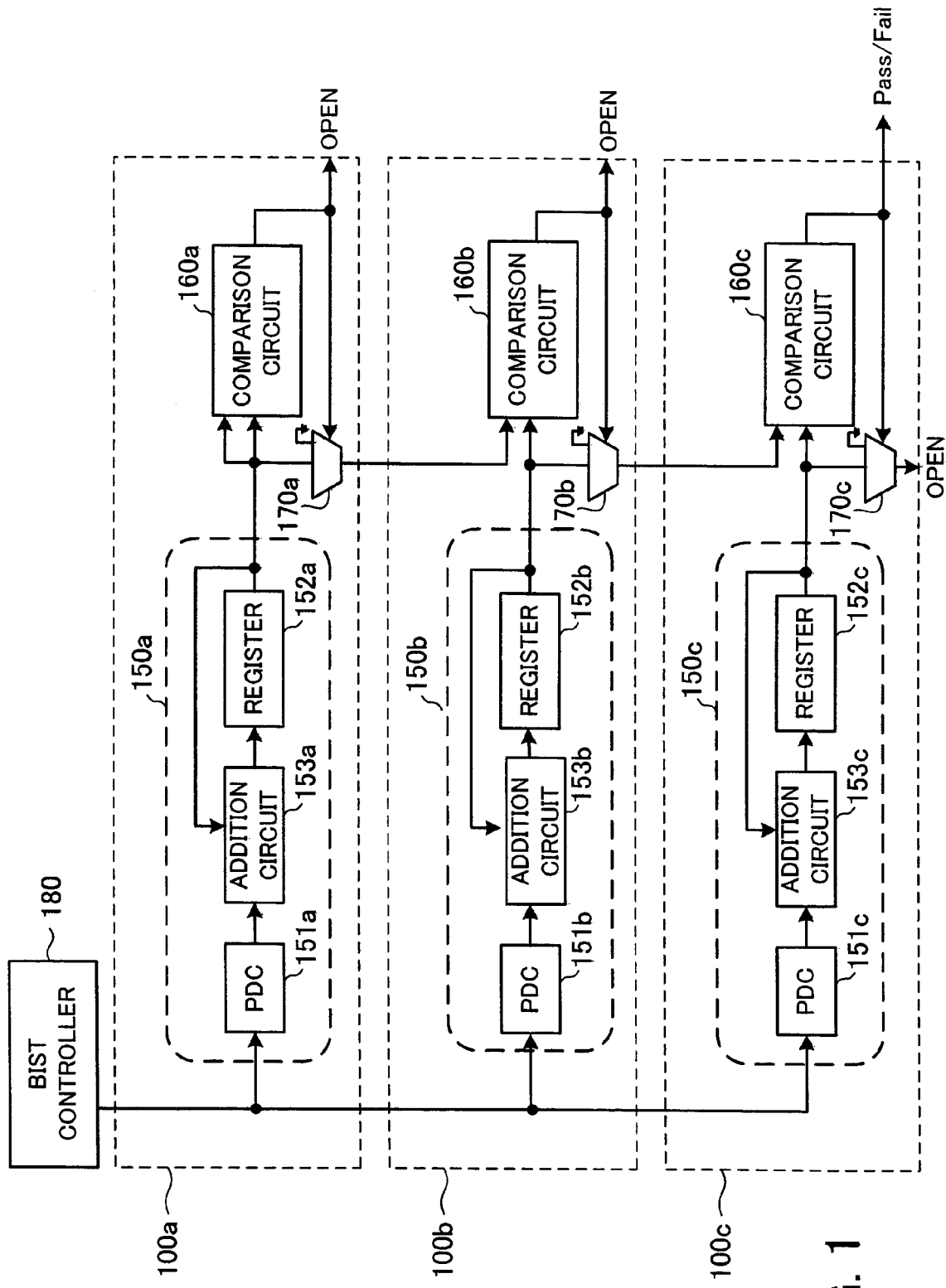
FIG. 1 shows a schematic configuration of a circuit provided, on a semiconductor chip, for performing an operation test of a digital filter according to an embodiment of the present invention.

Using, as an example, a case where preferred embodiments of the present invention are applied to a signal reception circuit capable of high-speed data reception, preferred embodiments of the present invention will be described in detail below with reference to the accompanying drawings, wherein like reference numerals refer to like elements throughout.

Figure 2:
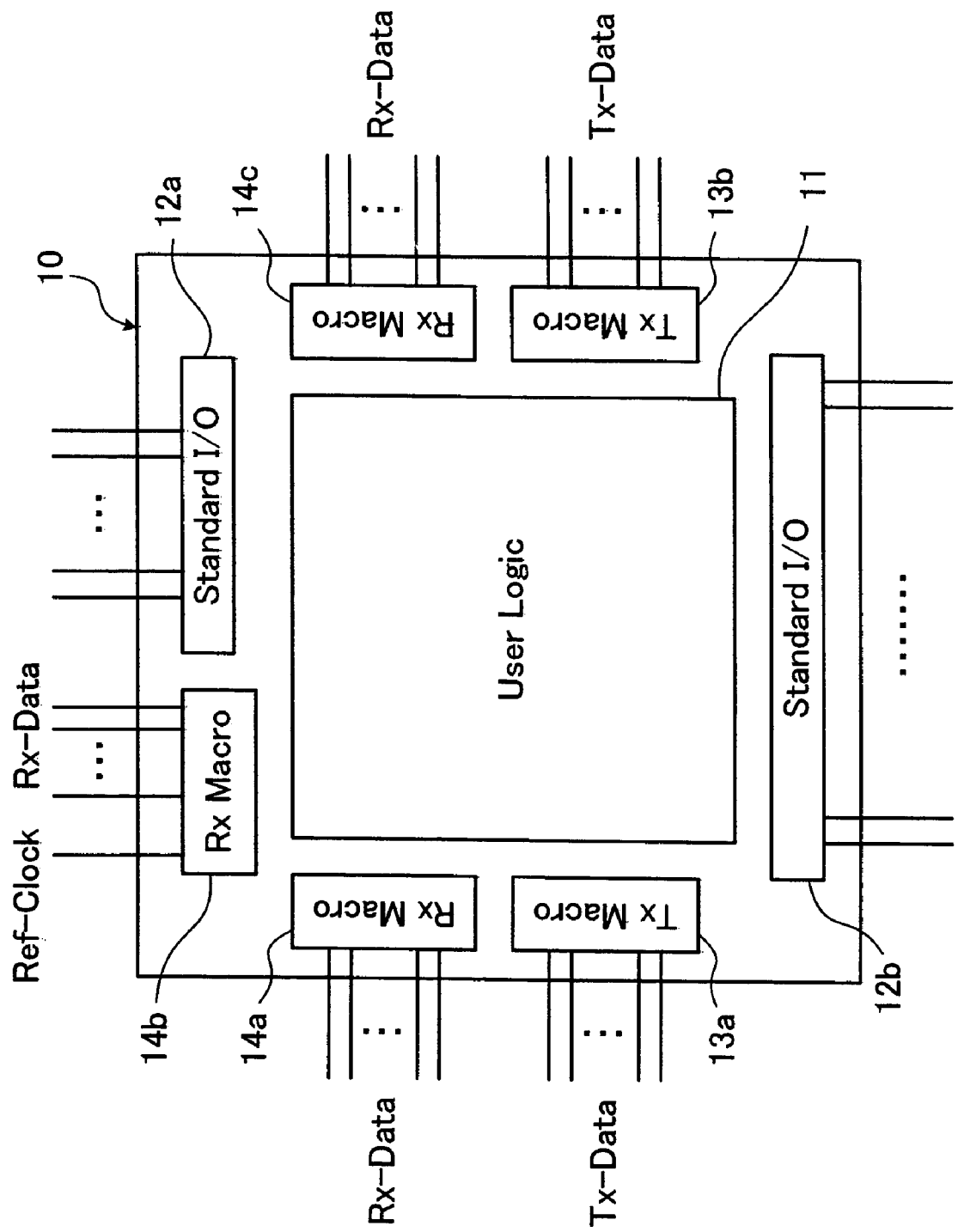
FIG. 2 shows a configuration example of a semiconductor chip having mounted thereon a signal receiving circuit according to an embodiment of the present invention.
Figure 3:
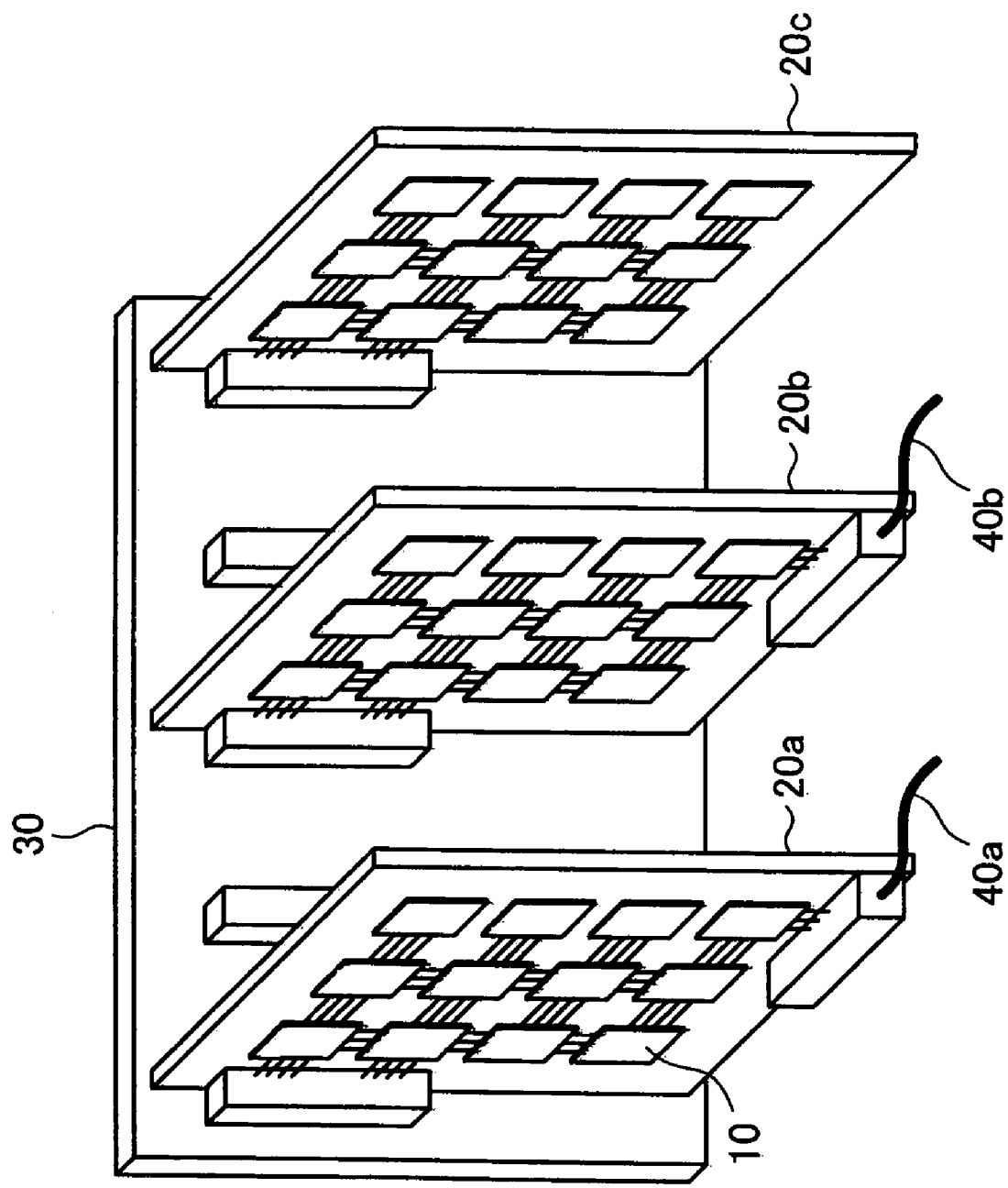
FIG. 3 illustrates an application of a signal receiving circuit according to an embodiment of the present invention.

FIG. 2 shows a configuration example of a semiconductor chip having mounted thereon a signal receiving circuit according to an embodiment of the present invention. FIG. 3 illustrates an application of the signal receiving circuit.

Around a user logic circuit 11 in a semiconductor chip 10 shown in FIG. 2, a plurality of transmitting end (Tx) macro circuits 13a and 13b, and a plurality of receiving end (Rx) macro circuits 14a, 14b and 14c each are provided as a high-speed interface macro circuit for the signal transmission between other semiconductor chips, etc. together with standard input/output circuits 12a and 12b.

In a communication apparatus for high-speed digital communication, for example, a plurality of the semiconductor chips 10 as described above are mounted on respective printed wiring boards 20a, 20b and 20c as shown in FIG. 3. Further, some of these semiconductor chips 10 on the printed wiring boards 20a, 20b and 20c are connected to another printed wiring board through a board connecting device 30, or cables 40a and 40b.

As described above, each of the semiconductor chips 10 includes a plurality of interface macro circuits for data transmission between other semiconductor chips 10. Those transmitting end macro circuits and those receiving end macro circuits each have the same circuit configuration. The signal receiving circuit described in the following embodiment is equivalent to the receiving end macro circuit, and a plurality of the signal receiving circuits having the same configuration are integrated on the same semiconductor chip 10.

Figure 4:
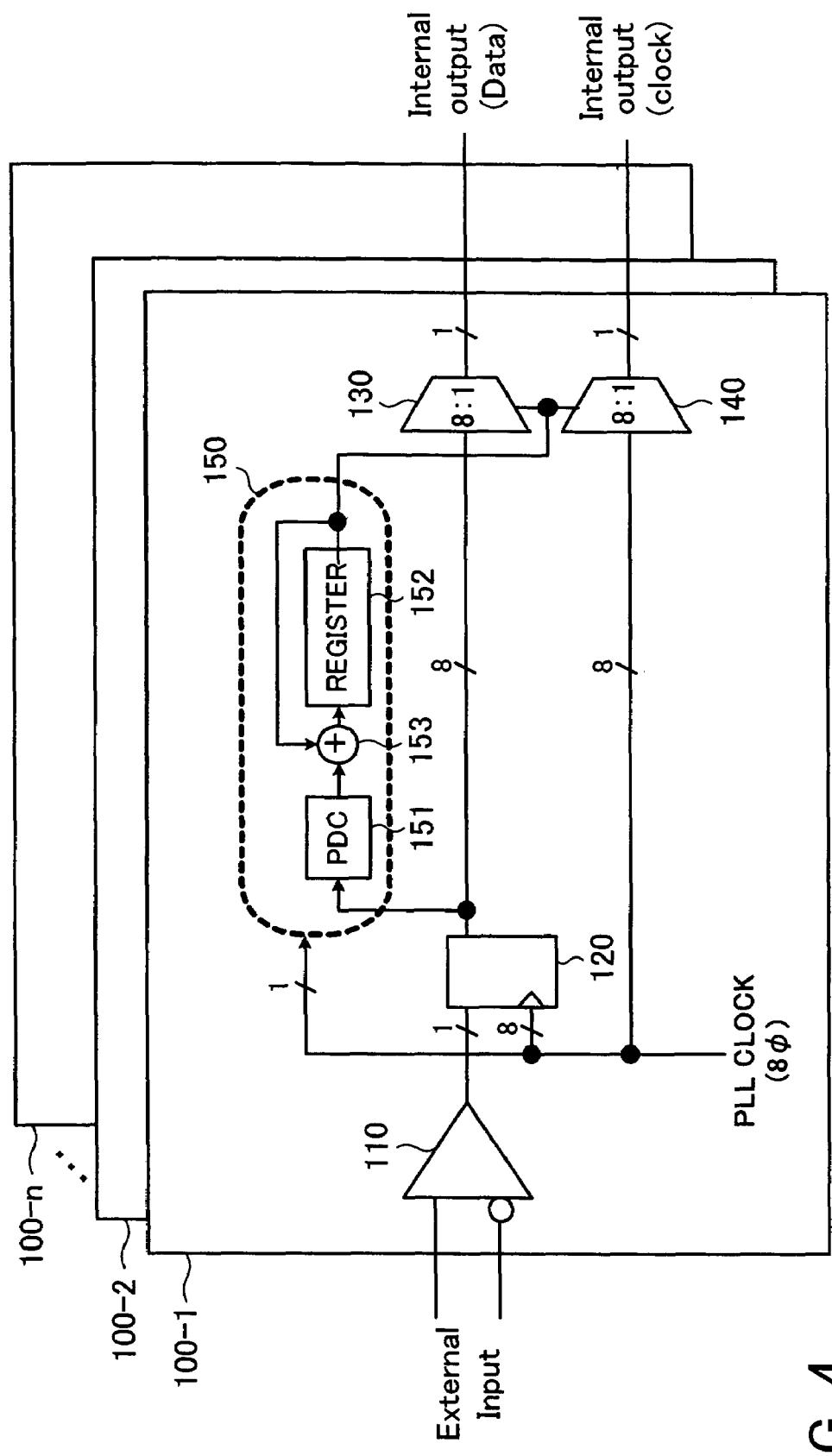
FIG. 4 shows an internal configuration of a signal receiving circuit according to an embodiment of the present invention.

FIG. 4 shows an internal configuration of a signal receiving circuit according to an embodiment of the present invention.

As shown in FIG. 4, the signal receiving circuit 100 (100-1 to 100-$n$, provided that n is an integer of two or more) includes an input circuit 110, a sampler circuit 120, selection circuits 130 and 140, and a digital filter 150. Specifically, the input circuit 110 includes a differential amplifier that receives input data from the outside. The sampler circuit 120 latches output data of the input circuit 110 by each of multiphase clocks. The selection circuits 130 and 140 each selectively output one of the respective data latched by the sampler circuit 120 and one of the multiphase clocks. The digital filter 150 outputs a code signal used for controlling operations of these selection circuits 130 and 140.

The sampler circuit 120 latches the data received by the input circuit 110 by each of the multiphase clocks. The multiphase clock is generated by gradually shifting phases of the clocks generated by the PLL (Phase Locked Loop). In the present embodiment, for example, eight-phase clocks are inputted to the sampler circuit 120 to latch the data, and the latched eight data are inputted to the selection circuit 130 from the sampler circuit 120. Further, the eight-phase clocks each are inputted also to the selection circuit 140.

The selection circuits 130 and 140 each selectively output one of the inputted eight-phase clocks in response to a code signal from the digital filter 150. The digital filter 150 operates based on the clock generated by the PLL so as to generate a digital code according to a phase difference of the respective data latched by the sampler circuit 120 and so as to output it as a control signal of the selection circuits 130 and 140. As a result, a clock synchronized with the receive data from the outside is recovered from the selection circuit 140, and the correct receive data synchronized with this clock are outputted from the selection circuit 130.

The digital filter 150 includes a PDC 151, a register 152 and an addition circuit 153. The PDC 151 converts the phase difference of the respective data latched by the sampler circuit 120 into a digital signal. The register 152 is employed as the output stage to the selection circuits 130 and 140. The addition circuit 153 adds respective output signals of the PDC 151 and the register 152 and feeds back the result to the register 152. In this digital filter 150, an integration circuit is configured by the register 152 and the addition circuit 153.

Herein, an operation test of this digital filter 150 is performed as follows. The input signal to the PDC 151 is controlled by a BIST controller described later. Based on this control, the output signal of the PDC 151 is set to a fixed value (e.g., "1"), and the integration circuit configured by the register 152 and the addition circuit 153 is allowed to operate as a counter that increments an output value by +1. At this time, the output value of the register 152 obtained by this operation is compared with an expected value, whereby the test can be conducted whether the digital filter 150 is correctly operated.

FIG. 1 shows a schematic configuration of a circuit provided, on a semiconductor chip, for performing an operation test of the digital filter 150.

As an example, a case is described below where three signal receiving circuits 100a to 100c having the same configuration are provided on the same semiconductor chip. As shown in FIG. 1, digital filters 150a to 150c are provided on the signal receiving circuits 100a to 100c, respectively. As described above, these digital filters 150a to 150c include PDCs 151a to 151c, registers 152a to 152c and addition circuits 153a to 15c, respectively. In addition thereto, in the present embodiment, comparison circuits 160a to 160c and output selection circuits 170a to 170c for a test circuit of the digital filters 150a to 150c are provided on the signal receiving circuits 100a to 100c, respectively. Further, a BIST controller 180 that feeds the same test signal to the respective digital filters 150a to 150c also is provided on the same semiconductor chip.

The comparison circuits 160a to 160c compare the output values and expected values of the corresponding digital filters 150a to 150c in the conduct of the operation test, and determine whether the output values and the expected values coincide with each other. The comparison circuits 160a to 160c have input terminals of the output values and expected values of the digital filters 150a to 150c one by one, respectively. In the present embodiment, the output terminal of the digital filter and the expected value input terminal of the comparison circuit are daisy-chained such that the output value of one digital filter is employed as the expected value of the comparison circuit connected to another digital filter. In an example shown in FIG. 1, the output value of the digital filter 150a is employed as the expected value of the comparison circuit 160b connected to the adjacent digital filter 150b through the output selection circuit 170a. Similarly, the output value of the digital filter 150b is employed as the expected value of the comparison circuit 160c connected to the adjacent digital filter 150c through the output selection circuit 170b.

Herein, the same signal is outputted from the respective digital filters 150a to 150c by the control of the BIST controller 180. Therefore, when all the digital filters 150a to 150c normally operate, the comparison results of all the comparison circuits 160a to 160c are expressed as "Pass" which means matching. On the other hand, when an abnormally operating digital filter occurs, the comparison result of the comparison circuit to which the output value of the abnormal digital filter is inputted is expressed as "Fail" which means mismatching, so that occurrence of abnormal digital filter can be detected. Thus, the occurrence of abnormal digital filter can be detected even when the expected values of the respective digital filters 150a to 150c are not individually prepared.

The comparison results of the comparison circuits 160a to 160c may be outputted outside, for example, by providing a gate circuit that obtains the logical product of the output signals of the respective comparison circuits 160a to 160c. Alternatively, by providing the output selection circuits 170a to 170c that each operate depending on the comparison results of the comparison circuits 160a to 160c as shown in FIG. 1, the output of the comparison circuit (in FIG. 1, the comparison circuit 160c) positioned at the end side of a daisy-chain-connection structure may be taken out as the test results.

In FIG. 1, when the comparison results of the comparison circuits 160a to 160c are expressed as "Pass", the output selection circuits 170a to 170c directly output the output values of the corresponding-digital filters 150a to 150c, respectively. On the contrary, when the comparison results thereof are expressed as "Fail", a fixed value is outputted independently of the output values of the digital filters 150a to 150c. In the present embodiment, the value of "0" (all the output values are at an L level) is outputted as the fixed value.

The output terminal of the output selection circuit 170a is connected to the expected value input terminal of the comparison circuit 160b. The output terminal of the output selection circuit 170b is connected to the expected value input terminal of the comparison circuit 160c. The output terminal of the output selection circuit 170c is opened. Herein, this output selection circuit 170c is provided for facilitating the production by equalizing the circuit configurations of the respective signal receiving circuits 100a to 100c, though the circuit 170c is not used. Further, to two input terminals of the comparison circuit 160a, the output value of the simultaneously corresponding digital filter 150a is inputted. Thus, the comparison results of the comparison circuit 160c positioned at the end side of the daisy-chain-connection structure viewed from the comparison circuit 160a are outputted outside as the test results.

According to the circuit configuration as described above, when the comparison result in any of the comparison circuits 160a to 160c is expressed as "Fail", the fixed value "0" from the output selection circuit corresponding thereto is inputted to the expected value input terminal of the adjacent comparison circuit. In this way, the fixed value from the output selection circuit propagates toward the end of the daisy-chain-connection structure and finally appears as the comparison result of the comparison circuit 160c, whereby occurrence of the abnormal digital filter is detected.

Figure 5:
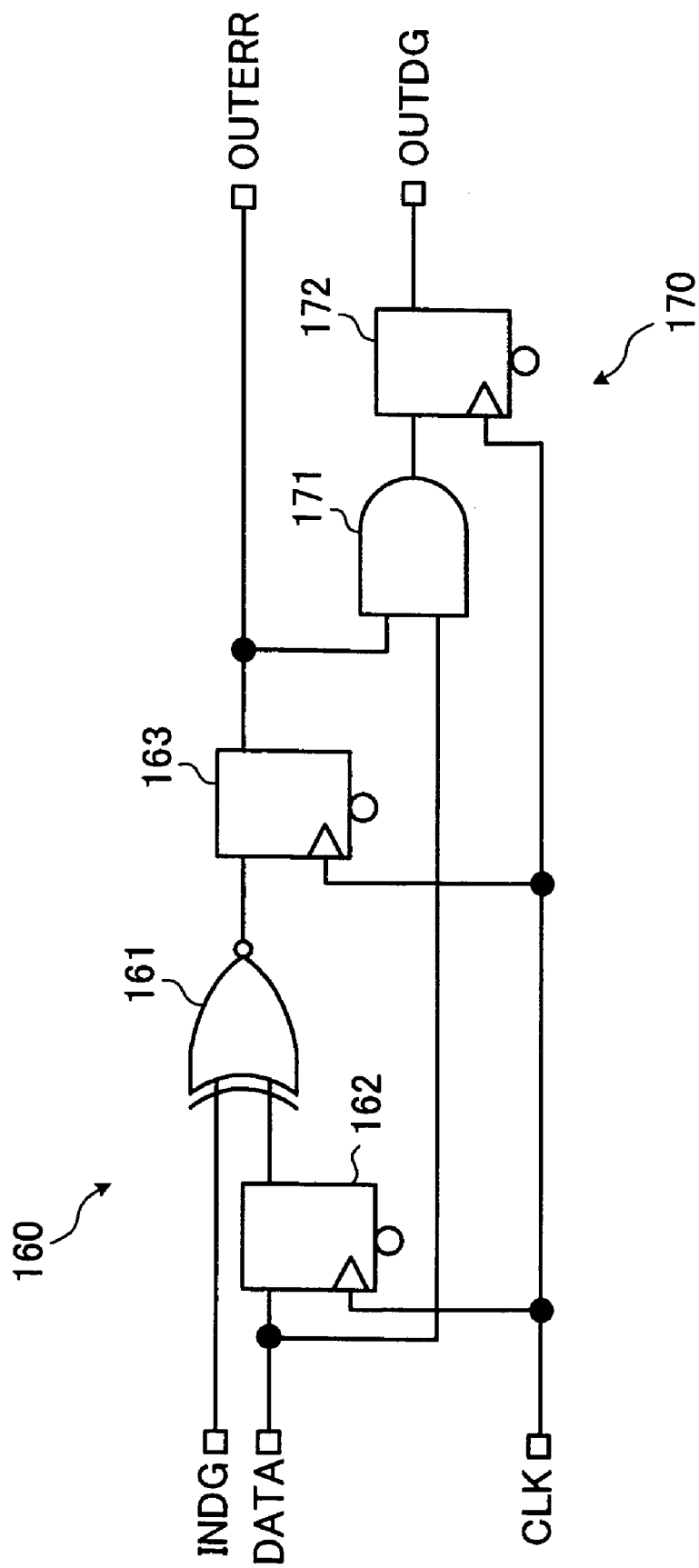
FIG. 5 shows a circuit configuration example of a comparison circuit and an output selection circuit each provided on a signal receiving circuit.

FIG. 5 shows a circuit configuration example of a comparison circuit and an output selection circuit.

As shown in FIG. 5, a comparison circuit 160 includes an EOR (exclusive OR) gate circuit 161 and two flip-flop circuits (FF) 162 and 163. An output selection circuit 170 includes an AND (logical product) gate circuit 171 and an FF 172.

The FF 162 latches the output data of the digital filter 150, which are inputted through a data input terminal DATA, at the input timing of a PLL clock inputted through a clock input terminal CLK. The EOR gate circuit 161 carries out an exclusive OR between the data latched by the FF 162 and the expected value data inputted through an expected value input terminal INDG. The FF 163 latches the inverted output signal of the EOR gate circuit 161 at the input timing of the PLL clock inputted through the clock input terminal CLK. The output signal of the FF 163 is outputted from an error output terminal OUTERR as a signal indicating the comparison result. The output signal goes to an L level when the comparison result between the output data and expected value data from the digital filter 150 is expressed as "Fail".

In the AND gate circuit 171, the data from the data input terminal DATA are inputted to one input terminal, and the output signal of the FF 163 is inputted to the other input terminal. The FF 172 latches the output signal of the AND gate circuit 171 at the input timing of the PLL clock inputted through the clock input terminal CLK. The latched signal is outputted from the expected value output terminal OUTDG. When the comparison result of the comparison circuit 160 is expressed as "Pass", the FF 172 directly outputs the data inputted through the data input terminal DATA. On the other hand, when the comparison result is expressed as "Fail", the FF 172 outputs a signal of L level.

Figure 6:
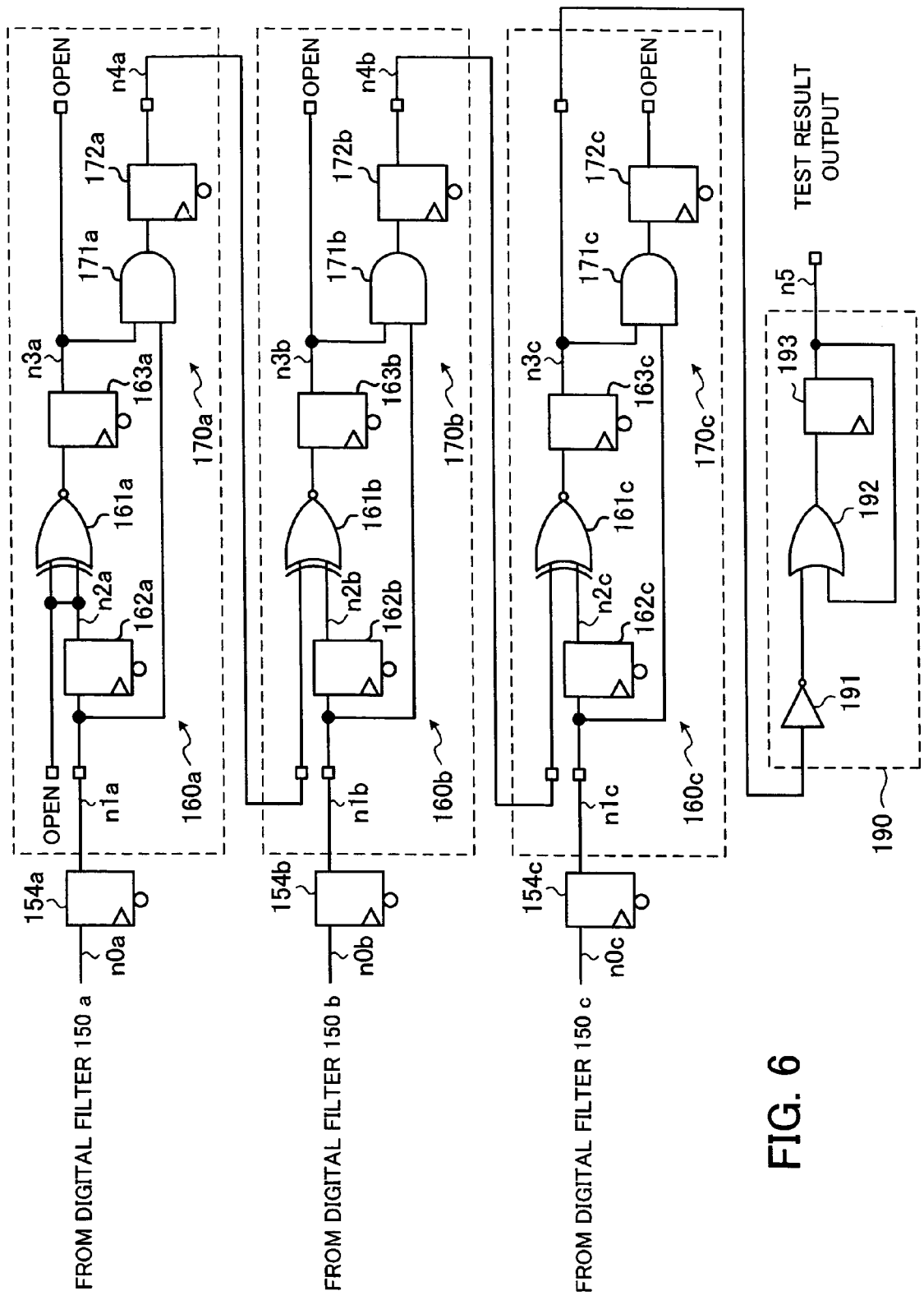
FIG. 6 shows a circuit configuration example in connecting comparison circuits and output selection circuits of respective signal receiving circuits.

FIG. 6 shows a circuit configuration example in connecting the comparison circuits and output selection circuits of the respective signal receiving circuits 100a to As shown in FIG. 6, the comparison circuit and the output selection circuit are connected such that the output signal of the FF 172a in the output selection circuit 170a corresponding to the signal receiving circuit 100a is inputted to the expected value input terminal of the EOR gate circuit 161b in the comparison circuit 160b corresponding to the signal receiving circuit 100b. Similarly, the comparison circuit and the output selection circuit are connected such that the output signal of the FF 172*b* in the output selection circuit 170*b* corresponding to the signal receiving circuit 100*b* is inputted to the expected value input terminal of the EOR gate circuit 161*c* in the comparison circuit 160*c* corresponding to the signal receiving circuit 100*c*. Each input terminal of the EOR gate circuit 161*a* in the comparison circuit 160*a* is short-circuited.

At the output stage of the comparison circuit 160*c*, a hold circuit 190 is provided on the same semiconductor chip. The hold circuit 190 holds an inversion signal of an output signal of the FF 163*c*, which indicates the comparison result, so as to output the test results. The hold circuit 190 includes an inverter circuit 191 that inverts the output signal of the FF 163*c*, an OR gate circuit 192 that has one input terminal to which the output signal of the inverter circuit 191 is fed, and an FF 193 that latches the output signal of the OR gate circuit 192 at the input timing of the PLL clock. The hold circuit 190 is configured such that the output signal of the FF 193 is fed back to the other input terminal of the OR gate circuit 192. The output signal of the FF 193 indicates the test results. As described later, when this signal goes to an L level, it is determined that any one of the digital filters 150*a* to 150*c* is abnormal.

The FFs 154*a* to 154*c* shown in FIG. 6 are arranged at the final output stage of the digital filters 150*a* to 150*c*, respectively. The FFs 154*a* to 154*c* latch the output data of the respective digital filters 150*a* to 150*c* at the input timing of the PLL clock, and feed the latched data to the respective comparison circuits 160*a* to 160*c*.

Figure 7:
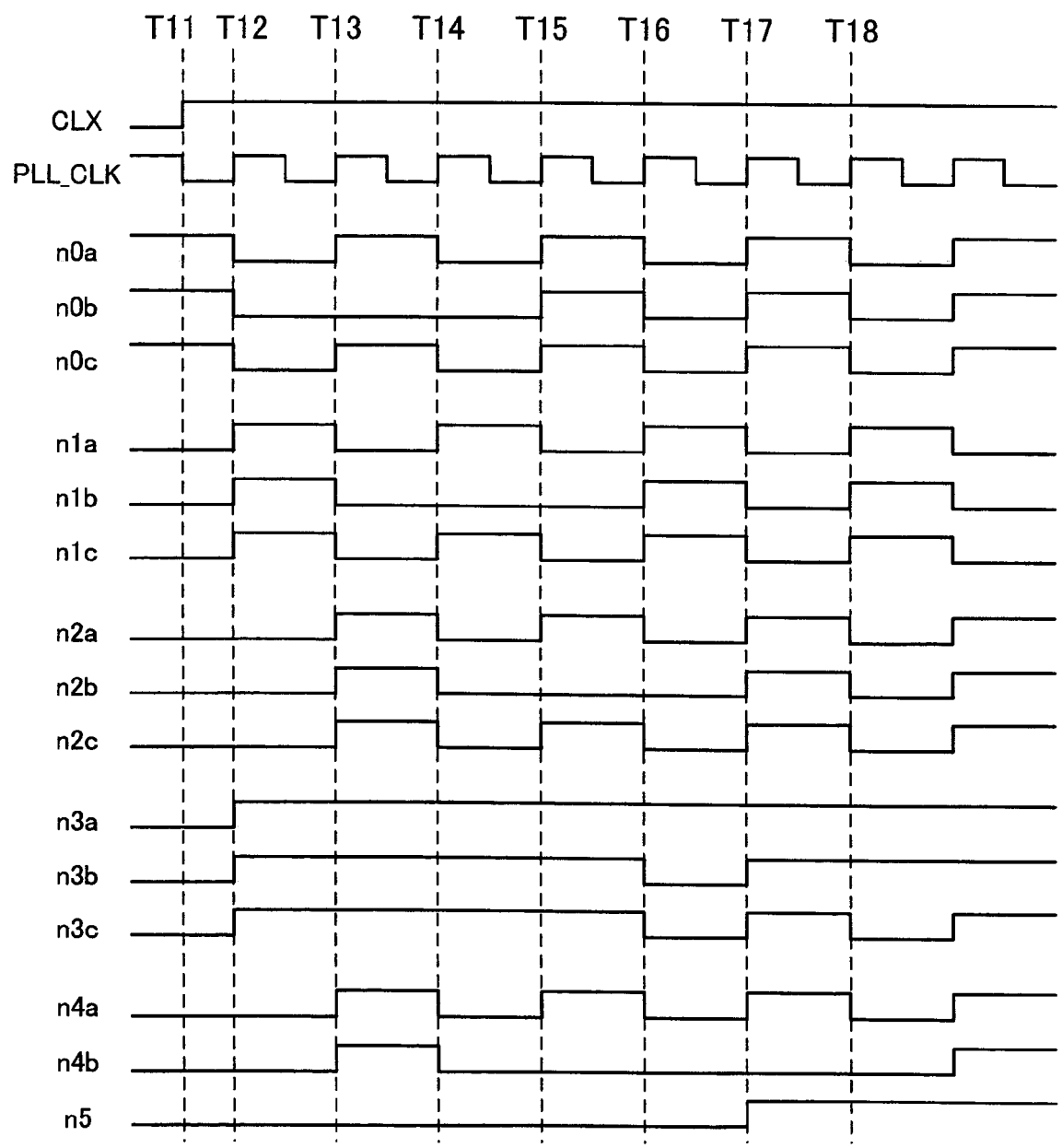
FIG. 7 is a timing chart showing a signal level of each of nodes on the circuits shown in FIG. 6.
Figure 8:
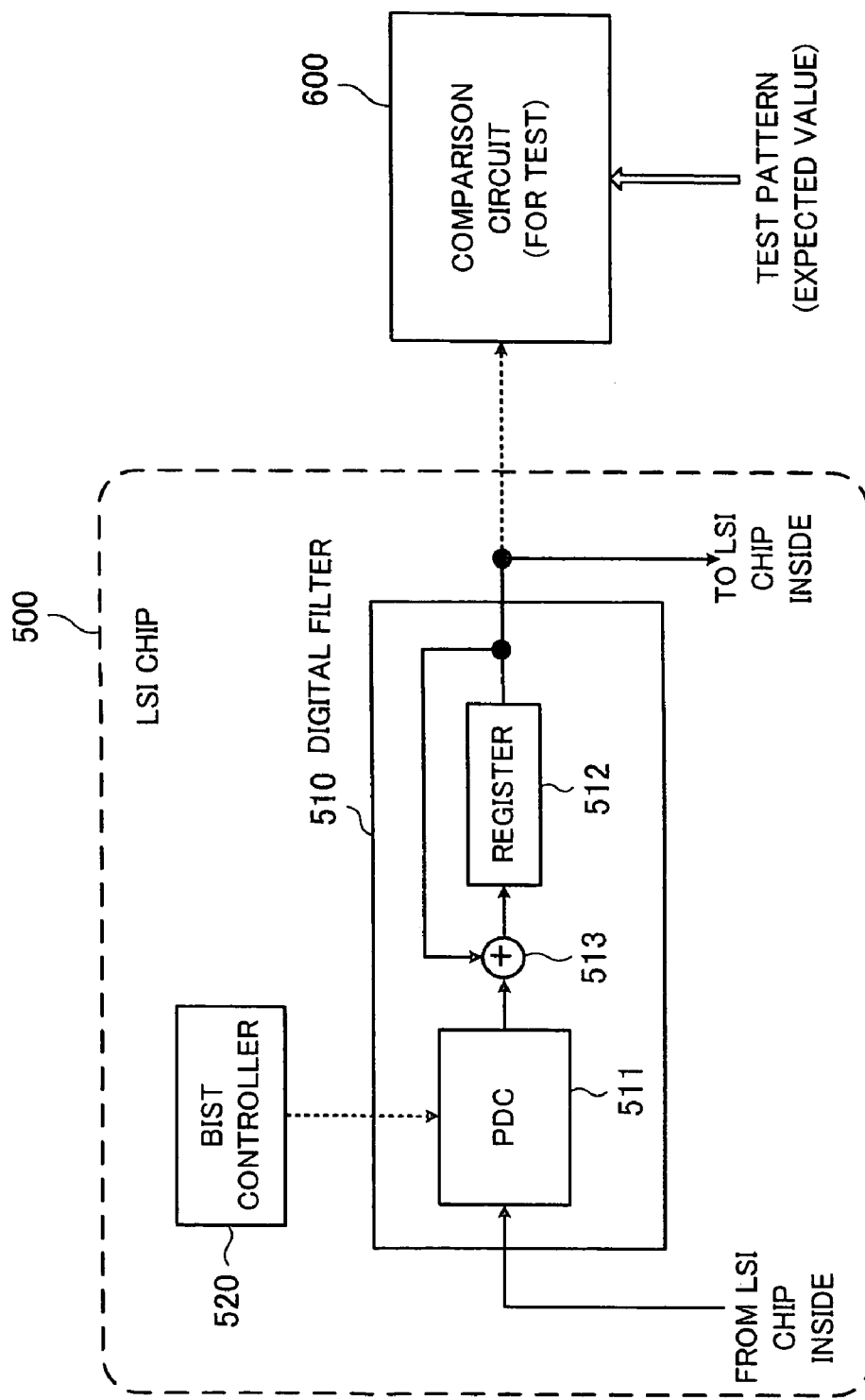
FIG. 8 shows a schematic configuration of a digital filter and a test circuit thereof each provided on a conventional signal receiving circuit.

FIG. 7 is a timing chart showing signal levels at the respective nodes on the circuits shown in FIG. 6. By referring to this timing chart, operations of the circuits are described below.

In FIG. 7, a node CLX is a node connected to a clear terminal of each of the FFs 162*a* to 162*c*, 163*a* to 163*c*, 172*a* to 172*c*, 154*a* to 154*c* and 193. When the signal level at this node CLX changes from an L level to an H level, the operation test is started.

A node PLL_CLK is a node connected to a clock input terminal of each of the FFs. Nodes n0*a* to n0*c* indicate nodes connected to the data input terminals of the FF5 154*a* to 154*c*, respectively. Nodes n1*a* to n1*c* indicate nodes connected to the data output terminals of the FFs 154*a* to 154*c*, respectively. Nodes n2*a* to n2*c* indicate nodes connected to the data output terminals of the FFs 162*a* to 162*c*, respectively. Nodes n3*a* to n3*c* indicate nodes connected to the data output terminals of the FFs 163*a* to 163*c*, respectively. Nodes n4*a* and n4*b* indicate nodes connected to the data output terminals of the FFs 172*a* and 172*b*, respectively. A node n5 indicates a node connected to the data output terminal of the FF 193.

In FIG. 7, the output values of the respective digital filters 150*a* to 150*c* are inverted at every clock cycle by the control of the BIST controller 180.

At first, operations at the time when the test result is determined to be "Pass" are described. For example, at the timing T11 when the test is started, any of the signal levels at the nodes n0*a* to n0*c* go to an "H" level. In this case, at the timing T12 when the next clock rises, these signals are latched by the FFs 154*a* to 154*c*. As a result, the signal levels at the nodes n1*a* to n1*c* concurrently go to an H level.

Furthermore, at the timing T13 when the next clock rises, these signals are latched by the FFs 162*a* to 162*c*. As a result, the signal levels at the nodes n2*a* to n2*c* concurrently go to an K level, and the respective signals are fed to the EOR gate circuits 161*a* to 161*c*. At the same time, the same signals are latched also by the FFs 172*a* to 172*c*. As a result, the signal levels at the nodes n4*a* and n4*b* go to an H level, and the respective signals are inputted to the expected value input terminals of the EOR gate circuits 161*b* and 161*c* on the output sides of the FFs 172*a* and 172*b*. Therefore, the EOR gate circuits 161*b* and 161*c* compare the data from the respectively corresponding digital filters 150*b* and 150*c* and the data from the respectively adjacent digital filters 150*a* and 150*b* at the same timing.

At the timing T14 when the next clock rises, since the comparison result is expressed as "Pass", the signal levels at the nodes n3*b* and n3*c* connected to the data output terminals of the EOR gate circuits 161*b* and 161*c* remain at an H level. At this time, an inversion signal of the signal at the node n3*c* is latched by the FF 193 of the hold circuit 190 at the timing T15 when the next clock rises. Therefore, the signal level at the node n5 connected to the data output terminal of the FF 193 remains at an L level and as a result, the test result is determined to be "Pass".

Subsequently, operations at the time when the test result is determined to be "Fail" are described. For example, at the timing T13, the signal level at only the node n0*b* among the nodes n0*a* to n0*c* is an L level and therefore, it is considered that the digital filter 150*b* is abnormal. In this case, these signals are propagated to the nodes n1*a* to n1*c* at the timing T14 and then propagated to the nodes n2*a* to n2*c* at the timing T15. At this time, the signals at the nodes na1*a* and n1*b* are simultaneously inputted also to the expected value input terminals of the EOR gate circuits 161*b* and 161*c* through the nodes n4*a* and n4*b*. In this case, the signal level at only the node n1*b* among the nodes n1*a* to n1*c* is an L level and therefore, the signal levels of the two input terminals provided on each of the EOR gate circuits 161*b* and 161*c* are different from each other.

Accordingly, at the timing T16 when the next clock rises, the signal levels at the nodes n3*b* and n3*c* go to an L level in response to the comparison operation of the EOR gate circuits 161*b* and 161*c*. Among these signals, an inversion signal of the signal at the node n3*c* is latched by the FF 193 of the hold circuit 190 at the timing T17 when the next clock rises. Therefore, the signal level at the node n5 goes to an H level and as a result, the test result is determined to be "Fail". Further, the signal at the node n5 is fed back to the OR gate circuit 192 and therefore, the signal level at the node n5 is subsequently held at an H level.

In the above-described circuit configuration, the comparison circuits 160*a* to 160*c* concurrently execute error detection operations (comparison operations in the EOR gate circuits 161*a* to 161*c*) on the output data of the respectively corresponding digital filters 150*a* to 150*c*. In any one of the comparison circuits 160*a* to 160*c*, when the comparison result is expressed as "Fail" even once, an L level signal indicating the error detection is gradually propagated toward a direction of the following comparison circuit 160*c*. For example, when only the output data of the digital filter 150*a* go to an L level, errors are detected by the EOR gate circuit 61*b* of the comparison circuit 160*b*. Thereafter, when two clock cycles elapse, errors are detected by the EOR gate circuit 161*c* and as a result, the output signal of the hold circuit 190 is changed in the next clock cycle.

As described above, according to the present embodiment, the expected value for use in collation of the test results is not required for each of the digital filters 150*a* to 150*c*, and the operations for the comparison between the output value and the expected value also are concurrently executed. Further, an exterior comparison apparatus that compares the output signal and expected value during the test is not used and therefore, the reconnection of terminals is not required during the operation test of all the digital filters 150*a* to 150*c*. Accordingly, the time of the operation test is shortened and operation trouble is reduced, so that the testing efficiency can be improved and the cost can be reduced.

In the above-described embodiment, a case is described where the present invention is applied to the signal receiving circuit that performs high-speed data reception; however, the present invention is not limited thereto. When the present invention is applied to a case where a plurality of electric circuits having the same circuit configuration are formed on one semiconductor chip, the time of the operation test of each electric circuit can be shortened.

In the above-described embodiment, a case is described where a plurality of electric circuits having the same circuit configuration are mounted on one semiconductor chip; however, the present invention is not limited thereto. The present invention can also be applied, for example, to a semiconductor system including a plurality of semiconductor devices each having mounted thereon electric circuits having the same configuration. In this case, a plurality of comparison circuits that compare an output value and an expected value of each electric circuit are individually provided per one semiconductor device, the electric circuit and the comparison circuit are daisy-chained such that the output value of each electric circuit is inputted as the expected value of the comparison circuit within another semiconductor device, and the same test signal is inputted to each electric circuit to allow an abnormal operation in the electric circuit within any one of the semiconductor devices to be detected, so that the testing efficiency can be improved.

According to the present invention, occurrence of any abnormal electric circuit can be detected even when an expected value for use in collation of the test results is not required for each of a plurality of the electric circuits. Therefore, reconnection to an exterior apparatus for testing is not also required. Accordingly, the operation test of the semiconductor apparatus including a plurality of electric circuits having the same configuration, which are mounted on the same semiconductor chip, can be effectively performed in a short time.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be, regarded as falling within the scope of the invention in the appended claims and their equivalents.

What is claimed is:

1. A semiconductor device having a plurality of electric circuits having the same configuration, which are mounted on the same semiconductor chip, the semiconductor device comprising:
   a plurality of comparison circuits that compare an output value and an expected value of each electric circuit, the comparison circuits being individually provided per one electric circuit, and
   a plurality of output selection circuits individually provided per one electric circuit,
   wherein the electric circuit, the comparison circuit, and the output selection circuit are daisy-chained such that when respective input values of the comparison circuits corresponding to the electric circuits coincide with each other, an output value of the corresponding electric circuit is directly output from the corresponding output selection circuit as the expected value of another comparison circuit, whereas when respective input values of the comparison circuits do not coincide with each other, a fixed value is output from the corresponding output selection circuit,
   wherein when the same test signal is input to each electric circuit, the comparison result of at least one of the comparison circuits is output as the test results.

2. The semiconductor device according to claim 1, wherein the electric circuit and the comparison circuit are connected such that the output value of any one of the electric circuits is inputted as the expected value to the comparison circuit corresponding said electric circuit and the comparison results of the comparison circuit positioned at the endmost side of a daisy-chain connection structure viewed from said comparison circuit side are outputted as test results.

3. The semiconductor device according to claim 2, wherein:
   the comparison circuit comprises a first latch circuit that latches an output value from the corresponding electric circuit at an input timing of a clock, and an exclusive-OR gate circuit that comprises one input terminal to which an output signal of the first latch circuit is inputted, and
   the output selection circuit comprises a second latch circuit which, when the output signal of the exclusive-OR gate circuit in the corresponding comparison circuit is a positive logic signal, latches the output value from the corresponding electric circuit and feeds the latched value to another input terminal of the exclusive-OR gate circuit of another comparison circuit connected, at the same timing as the input to the first latch circuit of said comparison circuit.

4. The semiconductor device according to claim 3, wherein:
   the comparison circuit comprises a third latch circuit that latches an inversion signal of the exclusive-OR gate circuit at the input timing of the clock,
   the output selection circuit comprises a logical product gate circuit that obtains a logical product of an output signal of the third latch circuit in the corresponding comparison circuit and an output signal to the first latch circuit in said comparison circuit, and
   the second latch circuit latches the output signal of the logical product gate circuit at the input timing of the clock, and outputs, as the test results, the output value of the third latch circuit in the output selection circuit positioned at the end side of the daisy-chain connection structure.

5. The semiconductor device according to claim 1, wherein the output selection circuit outputs a negative logic signal as the fixed value when respective input values of the corresponding comparison circuits do not coincide with each other.

6. The semiconductor device according to claim 1, wherein a test signal output circuit that feeds the same test signal to each electric circuit is further provided on the semiconductor chip.

7. A test method of a semiconductor device having a plurality of electric circuits having the same configuration, which are mounted on the same semiconductor chip, the test method comprising the steps of:
   (1) individually providing, per one electric circuit, comparison circuits that compare an output value and an expected value of each electric circuit,
   (2) individually providing, per one electric circuit, output selection circuits, (3) daisy-chaining the electric circuit, the comparison circuit, and the output selection circuit such that when respective input values of the comparison circuits corresponding to the electric circuits coincide with each other, an output value of the corresponding electric circuit is directly output from the corresponding output selection circuit as the expected value of another comparison circuit, whereas when respective input values of the comparison circuits do not coincide with each other, a fixed value is output from the corresponding output selection circuit, and (4) inputting the same test signal to each electric circuit to allow the comparison result of at least one of the comparison circuits to be outputted as the test results.

8. A semiconductor system having a plurality of semiconductor devices each having mounted thereon electric circuits having the same configuration, the semiconductor system comprising:

a plurality of comparison circuits which are individually provided per one semiconductor device and compare an output value and an expected value of each electric circuit in each semiconductor device, and a plurality of output selection circuits individually provided per one electric circuit, wherein the electric circuit, the comparison circuit, and the output selection circuit are daisy-chained such that when respective input values of the comparison circuits corresponding to the electric circuits coincide with each other, an output value of the corresponding electric circuit is directly output from the corresponding output selection circuit as the expected value of another comparison circuit, whereas when respective input value of the comparison circuits do not coincide with each other, a fixed value is output from the corresponding output selection circuit, wherein when the same test signal is input to each electric circuit, the comparison result of at least one of the comparison circuits is output as the test results.

9. A test method of a semiconductor system having a plurality of semiconductor devices each having mounted thereon electric circuits having the same configuration, the test method comprising the steps of:

(1) individually providing, per one electric circuit, comparison circuits that compare an output value and an expected value of each electric circuit in each semiconductor device, (2) individually providing, per one electric circuit, output selection circuits, (3) daisy-chaining the electric circuit, the comparison circuit, and the output selection circuit such that when respective input values of the comparison circuits corresponding to the electric circuits coincide with each other, an output value of the corresponding electric circuit is directly output from the corresponding output selection circuit as the expected value of another comparison circuit, whereas when respective input values of the comparison circuits do not coincide with each other, a fixed value is output from the corresponding output selection circuit, and (4) inputting the same test signal to each electric circuit to allow the comparison result of at least one of the comparison circuits to be output as the test results.

* * * * *